(12) United States Patent
Antoni et al.

(10) Patent No.: US 6,947,120 B2
(45) Date of Patent: Sep. 20, 2005

(54) ILLUMINATION SYSTEM PARTICULARLY FOR MICROLITHOGRAPHY

(75) Inventors: Martin Antoni, Aalen (DE); Wolfgang Singer, Aalen (DE); Johannes Wangler, Königsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 85 days.

(21) Appl. No.: 10/381,626

(22) PCT Filed: Sep. 28, 2001

(86) PCT No.: PCT/EP01/11233

§ 371 (c)(1),
(2), (4) Date: Aug. 20, 2003

(87) PCT Pub. No.: WO02/27400

PCT Pub. Date: Apr. 4, 2002

(65) Prior Publication Data

US 2004/0022353 A1 Feb. 5, 2004

Related U.S. Application Data

(63) Continuation-in-part of application No. 10/201,652, filed on Jul. 22, 2002, now Pat. No. 6,859,328, which is a continuation-in-part of application No. 10/150,650, filed on May 17, 2002, and a continuation-in-part of application No. 09/679,718, filed on Sep. 29, 2000, now Pat. No. 6,438,199, which is a continuation-in-part of application No. 09/305,017, filed on May 4, 1999, now Pat. No. 6,198,793.

(30) Foreign Application Priority Data

| May 5, 1998 | (DE) | 198 19 898 |
| Feb. 2, 1999 | (DE) | 199 03 807 |
| Feb. 8, 1999 | (DE) | 299 02 108 |
| Jul. 28, 2000 | (WO) | PCT/EP00/07258 |

(51) Int. Cl.[7] .................. G03B 27/42; G03B 27/54; G21K 5/00
(52) U.S. Cl. .................. 355/53; 355/67; 378/34
(58) Field of Search .................. 355/53, 67–71; 359/366, 859; 378/34

(56) References Cited

U.S. PATENT DOCUMENTS 4,195,913 A 4/1980 Dourte et al. ............... 350/292
(Continued)

FOREIGN PATENT DOCUMENTS

EP 0066295 A1 12/1982
(Continued)

OTHER PUBLICATIONS

Murphy et al., "Synchrotron Radiation Sources and Condensers for Projection X–Ray Lithography", Applied Optics, vol. 32, No. 34, pp. 6920–6929 (Dec. 1, 1993).
(Continued)

Copy of European Search Report, dated May 12, 2004.

Primary Examiner—Henry Hung Nguyen
(74) Attorney, Agent, or Firm—Ohlandt, Greeley, Ruggiero & Perle, L.L.P.

(57) ABSTRACT

There is provided an illumination system for microlithography with wavelengths ≦193 nm. The illumination system includes a primary light source, a first optical component, a second optical component, an image plane, and an exit pupil. The first optical component transforms the primary light source into a plurality of secondary light sources that are imaged by the second optical component in the exit pupil. The first optical component includes a first optical element having a plurality of first raster elements that are imaged into the image plane, producing a plurality of images being superimposed at least partially on a field in the image plane. The second optical component comprises a first optical system that includes at least a third field mirror with positive optical power and a second optical system that includes at least a second field mirror with positive optical power. The first optical system images the plurality of secondary light sources in a plane between the first optical system and the second optical system, forming a plurality of tertiary light sources, and the second optical system images the plurality of tertiary light sources in the exit pupil.

21 Claims, 2 Drawing Sheets

U.S. PATENT DOCUMENTS

| | | | |
|---|---|---|---|
| 4,294,538 A | 10/1981 | Ban | 355/51 |
| 4,389,115 A | 6/1983 | Richter | 355/26 |
| 4,651,012 A | 3/1987 | Clark et al. | 250/505.1 |
| 4,688,932 A | 8/1987 | Suzuki | 355/51 |
| 4,740,276 A | 4/1988 | Marmo et al. | 204/7 |
| 5,071,240 A | 12/1991 | Ichihara et al. | 359/366 |
| 5,148,442 A | 9/1992 | O'Neil et al. | 372/71 |
| 5,222,112 A | 6/1993 | Terasawa et al. | 378/34 |
| 5,339,346 A | 8/1994 | White | 378/34 |
| 5,353,322 A | 10/1994 | Bruning et al. | 378/34 |
| 5,361,292 A | 11/1994 | Sweatt | 378/34 |
| 5,402,267 A | 3/1995 | Fürter et al. | 359/727 |
| 5,439,781 A | 8/1995 | MacDowell et al. | 430/311 |
| 5,440,423 A | 8/1995 | Ogura | 359/365 |
| 5,459,547 A | 10/1995 | Shiozawa | 355/67 |
| 5,499,282 A | 3/1996 | Silfvast | 378/119 |
| 5,512,759 A | 4/1996 | Sweatt | 250/492.1 |
| 5,581,605 A | 12/1996 | Murakami et al. | 378/84 |
| 5,644,383 A | 7/1997 | Mori | 355/68 |
| 5,647,664 A | 7/1997 | Hanečka | 362/308 |
| 5,669,708 A | 9/1997 | Mashima et al. | 362/341 |
| 5,677,939 A | 10/1997 | Oshino | 378/34 |
| 5,715,084 A | 2/1998 | Takahashi et al. | 359/487 |
| 5,737,137 A | 4/1998 | Cohen et al. | 359/859 |
| 5,755,503 A | 5/1998 | Chen et al. | 353/38 |
| 5,796,524 A | 8/1998 | Oómura | 359/633 |
| 5,805,356 A | 9/1998 | Chiba | 359/727 |
| 5,846,678 A | 12/1998 | Nishigori et al. | 430/30 |
| 5,896,438 A | 4/1999 | Miyake et al. | 378/34 |
| 5,963,305 A | 10/1999 | Mizouchi | 355/67 |
| 5,993,010 A | 11/1999 | Ohzawa et al. | 353/99 |
| 5,995,582 A | 11/1999 | Terashima et al. | 378/34 |
| 6,057,899 A | 5/2000 | Tanaka et al. | 349/95 |
| 6,081,319 A | 6/2000 | Ozawa et al. | 355/67 |
| 6,198,793 B1 | 3/2001 | Schultz et al. | 378/34 |
| 6,208,707 B1 | 3/2001 | Oshino | 378/34 |
| 6,229,647 B1 | 5/2001 | Takahashi et al. | 359/487 |
| 6,285,443 B1 * | 9/2001 | Wangler et al. | 355/67 |
| 6,339,467 B1 | 1/2002 | Sato | 355/77 |
| 6,400,794 B1 | 6/2002 | Schultz et al. | 378/34 |
| 6,438,199 B1 | 8/2002 | Schultz et al. | 378/34 |
| 6,507,440 B1 | 1/2003 | Schultz | 359/626 |
| 6,570,168 B1 * | 5/2003 | Schultz et al. | 250/492.2 |
| 6,583,937 B1 | 6/2003 | Wangler et al. | 359/624 |
| 6,594,334 B1 | 7/2003 | Ota | 378/34 |
| RE38,438 E | 2/2004 | Takahashi | 359/727 |

FOREIGN PATENT DOCUMENTS

| | | |
|---|---|---|
| EP | 0359018 A2 | 3/1990 |
| EP | 0779558 A2 | 6/1997 |
| EP | 0939341 A2 | 9/1999 |
| EP | 1026547 A2 | 8/2000 |
| EP | 1067437 A2 | 1/2001 |

OTHER PUBLICATIONS

"Handbook on Synchrotron Radiation", Ernst–Echard Koch ed., pp. 140–145, 1098–1111 (1983).

* cited by examiner

ILLUMINATION SYSTEM PARTICULARLY FOR MICROLITHOGRAPHY

CROSS-REFERENCE TO RELATED APPLICATIONS

The present application is (a) a U.S. national stage entry of International Application No. PCT/EP01/11233, and (b) a continuation-in part of U.S. patent application Ser. No. 10/201,652. The PCT/EP01/11233 application was filed Sept. 28, 2001, and claims priority of U.S. patent application Ser. No. 09/679,718. The 10/201,652 application was filed Jul. 22, 2002, and is (a) a continuation-in part of U.S. patent application Ser. No. 10/150,650, and (b) a continuation-in part of the 09/679,718 application. The 10/150,650 application was filed May 17, 2002, and is a continuation-in-part of the 09/679,718 application. The 09/679,718 application was filed Sept. 29, 2000, issued as U.S. Pat. No. 6,438,199, and is a continuation-in part of U.S. patent application Ser. No. 09/305,017. The 09/305,017 application was filed May 4, 1999, and issued as U.S. Pat. No. 6,198,793. The present application is also claiming priority of (a) International Application No. PCT/EP00/07258, filed Jul. 28, 2000, (b) German Patent Application No. 299 02 108, filed Feb. 8, 1999, (c) German Patent Application No. 199 03 807, filed Feb. 2, 1999, and (d) German Patent Application No. 198 19 898, filed on May 5, 1998.

BACKGROUND OF THE INVENTION (1) Field of the Invention

The invention concerns an illumination system for wavelengths $\leq 193$ nm as well as a projection exposure apparatus with such an illumination system.

(2) Description of the Invention

In order to be able to further reduce the structural widths of electronic components, particularly in the submicron range, it is necessary to reduce the wavelengths of the light utilized for microlithography. Lithography with very deep UV radiation, so called VUV (Very deep UV) lithography or with soft x-ray radiation, so-called EUV (extreme UV) lithography, is conceivable at wavelengths smaller than 193 nm, for example.

An illumination system for a lithographic device, which uses EUV radiation, has been made known from U.S. Pat. No. 5,339,346. For uniform illumination in the reticle plane and filling of the pupil, U.S. Pat. No. 5,339,346 proposes a condenser, which is constructed as a collector lens and comprises at least 4 pairs of mirror facets, which are arranged symmetrically. A plasma light source is used as the light source.

In U.S. Pat. No. 5,737,137, an illumination system with a plasma light source comprising a condenser mirror is shown, in which an illumination of a mask or a reticle to be illuminated is achieved by means of spherical mirrors.

U.S. Pat. No. 5,361,292 shows an illumination system, in which a plasma light source is provided, and the point plasma light source is imaged in an annular illuminated surface by means of a condenser, which has five aspherical mirrors arranged off-center.

From U.S. Pat. No. 5,581,605, an illumination system has been made known, in which a photon beam is split into a multiple number of secondary light sources by means of a plate with concave raster elements. In this way, a homogeneous or uniform illumination is achieved in the reticle plane. The imaging of the reticle on the wafer to be exposed is produced by means of a conventional reduction optics.

EP-A-0 939 341 shows an illumination system and exposure apparatus for illuminating a surface over an illumination field having an arcuate shape with X-ray wavelength light. The illumination system comprises first and second optical integrators each with a plurality of reflecting elements. The first and second optical integrators being opposingly arranged such that a plurality of light source images are formed at the plurality of reflecting elements of the second optical integrator. To form an arcuate shaped illumination field in the field plane according to EP 0 939 341 A2 the reflecting elements of the first optical integrator have an arcuate shape similar to the arcuate illumination field. Such reflecting elements are complicate to manufacture.

EP-A-1 026 547 also shows an illumination system with two optical integrators. Similar to the system of EP-A-0 939 341 the reflecting elements of the first optical integrator have an arcuate shape for forming an arcuate shaped illumination field in the field plane.

In EP-A-0 955 641 a system with two optical integrators is shown. Each of said optical integrators comprises a plurality of raster elements. The raster elements of the first optical integrator are of rectangular shape. The arc shaped field in the field plane is formed by at least one grazing incidence field mirror. The content of the above mentioned patent-applications are incorporated by reference.

All systems of the state of the art, e.g. the systems according EP-A-0 939 341 or EP-A-1 026 547 have the disadvantage that the track-length, of the illumination system is large.

It is therefore an object of the invention to overcome the disadvantages of the illumination systems according to the state of the art and to provide an illumination system for microlithography that fulfills the requirements for advanced lithography with wavelength less or equal to 193 nm. The illumination system should be further compact in size and provide a plane in which devices could be placed to change the illumination mode or to filter the radiation of the beams.

SUMMARY OF THE INVENTION

The system illuminates a structured reticle arranged in the image plane of the illumination system, which will be imaged by a projection objective onto a light sensitive substrate. In scanner-type lithography systems the reticle is illuminated with a rectangular or arc-shaped field, wherein a pregiven uniformity of the scanning energy distribution inside the field is required, for example better than ±5%. The scanning energy is defined as the line integral over the light intensity in the scanning direction. The shape of the field is dependent on the type of projection objective. All reflective projection objectives typically have an arc-shaped field, which is given by a segment of an annulus. A further requirement is the illumination of the exit pupil of the illumination system, which is located at the entrance pupil of the projection objective. A nearly field-independent illumination of the exit pupil is required.

Typical light sources for wavelengths between 100 nm and 200 nm are excimer lasers, for example an ArF-Laser for 193 nm, an $F_2$-Laser for 157 nm, an $Ar_2$-Laser for 126 nm and an NeF-Laser for 109 nm. For systems in this wavelength region refractive components of $SiO_2$, $CaF_2$, $BaF_2$ or other crystallites are used. Since the transmission of the optical materials deteriorates with decreasing wavelength, the illumination systems are designed with a combination of refractive and reflective components. For wavelengths in the EUV wavelength region, between 10 nm and 20 nm, the projection exposure apparatus is designed as all-reflective. A typical EUV light source is a Laser-Produced-Plasma-source, a Pinch-Plasma-Source, a Wiggler-Source or an Undulator-Source.

The light of this primary light source is directed to a first optical element, wherein the first optical element is part of a first optical component. The first optical element is organized as a plurality of first raster elements and transforms the primary light source into a plurality of secondary light sources. Each first raster element corresponds to one secondary light source and focuses an incoming ray bundle, defined by all rays intersecting the first raster element, to the corresponding secondary light source. The secondary light sources are arranged in a pupil plane of the illumination system or nearby this plane. A second optical component is arranged between the pupil plane and the image plane of the illumination system to image the secondary light sources into an exit pupil of the illumination system, which corresponds to the entrance pupil of a following projection objective The first raster elements are imaged into the image plane, wherein their images are at least partially superimposed on a field that must be illuminated. Therefore, they are known as field raster elements or field honeycombs.

All-reflective projection objectives used in the EUV wavelength region have typically an object field being a segment of an annulus. Therefore the field in the image plane of the illumination system in which the images of the field raster elements are at least partially superimposed has preferably the same shape. The shape of the illuminated field can be generated by the optical design of the components or by masking blades which have to be added nearby the image plane or in a plane conjugated to the image plane.

According to the invention the second optical component of the illumination system comprises a first optical system comprising at least a third field mirror forming a plurality of the tertiary light sources in a plane conjugate to the exit pupil of the illumination system. The tertiary light sources are imaged by a second optical system comprising at least a second field mirror and a first field mirror into the exit pupil of the illumination system. The images of the tertiary light sources in the exit pupil of the illumination system are called quaternary light sources.

The field raster elements are preferably rectangular. Rectangular field raster elements have the advantage that they can be arranged in rows being displaced against each other. Depending on the field to be illuminated they have a side aspect ratio in the range of 5:1 and 20:1. The length of the rectangular field raster elements is typically between 15 mm and 50 mm, the width is between 1 mm and 4 mm.

To illuminate an arc-shaped field in the image plane with rectangular field raster elements the first field mirror of the second optical component preferably transforms the rectangular images of the rectangular field raster elements to arc-shaped images. The arc length is typically in the range of 80 mm to 105 mm, the radial width in the range of 5 mm to 9 mm. The transformation of the rectangular images of the rectangular field raster elements can be done by conical reflection with the first field mirror being a grazing incidence mirror with negative optical power. In other words, the imaging of the field raster elements is distorted to get the arc-shaped images, wherein the radius of the arc is determined by the shape of the object field of the projection objective. The first field mirror is preferably arranged in front of the image plane of the illumination system, wherein there should be a free working distance. For a configuration with a reflective reticle the free working distance has to be adapted to the fact that the rays traveling from the reticle to the projection objective are not vignetted by the first field mirror.

The surface of the first field mirror is preferably an off-axis segment of a rotational symmetric reflective surface, which can be designed aspherical or spherical. The axis of symmetry of the supporting surface goes through the vertex of the surface. Therefore a segment around the vertex is called on-axis, wherein each segment of the surfaces which does not include the vertex is called off-axis. The supporting surface can be manufactured more easily due to the rotational symmetry. After producing the supporting surface the segment can be cut out with well-known techniques.

The surface of the first field mirror can also be designed as an on-axis segment of a toroidal reflective surface. Therefore the surface has to be processed locally, but has the advantage that the surrounding shape can be produced before surface treatment.

The incidence angles of the incoming rays with respect to the surface normals at the points of incidence of the incoming rays on the first field mirror are preferably greater than 70°, which results in a reflectivity of the first field mirror of more than 80%.

The second field mirror with positive optical power is preferably an off-axis segment of a rotational symmetric reflective surface, which can be designed aspherical or spherical, or an on-axis segment of a toroidal reflective surface.

The incidence angles of the incoming rays With respect to the surface normals at the points of incidence of the incoming rays on the second field mirror are preferably lower than 25°. Since the mirrors have to be coated with multilayers for the EUV wavelength region, the divergence and the incidence angles of the incoming rays are preferably as low as possible to increase the reflectivity, which should be better than 65%. With the second field mirror being arranged as a normal incidence mirror the beam path is folded and the illumination system can be made more compact.

With the third field mirror of the second optical component the length of the illumination system can be reduced. The third field mirror is arranged between the plane with the secondary light sources and the second field mirror.

The third field mirror has positive optical power to generate images of the secondary light sources in a plane between the third and second field mirror, forming the tertiary light sources.

Since the plane with the tertiary light sources is arranged conjugated to the exit pupil, this plane can be used to arrange masking blades to change the illumination mode or to add transmission filters. This position in the beam path has the advantage to be freely accessible.

To have not great distances between the second and third field mirror and to reduce the refractive power at least of the second and third mirror the conjugated planes to the image plane in the second optical component are virtual conjugated planes. This means that there is no accessible conjugated real image plane, in which the arc shaped field is formed in the second optical component.

This is advantageous for a compact design: Furthermore field mirrors with low optical power are much easier to manufacture.

The third field mirror is similar to the second field mirror preferably an off-axis segment of a rotational symmetric reflective surface, which can be designed aspherical or spherical, or an on-axis segment of a toroidal reflective surface.

The incidence angles of the incoming rays with respect to the surface normals at the points of incidence of the incoming rays on the third field mirror are preferably lower than 25°. With the third field mirror being arranged as a normal incidence mirror the beam path can be folded and therefore reduce the overall size of the illumination system.

To avoid vignetting of the beam path the first, second and third field mirrors are preferably arranged in a non-centered system. There is no common axis of symmetry for the mirrors. An optical axis can be defined as a connecting line between the centers of the used areas on the field mirrors, wherein the optical axis is bent at the field mirrors depending on the tilt angles of the field mirrors.

With the tilt angles of the reflective components of the illumination system the beam paths between the components can be bent. Therefore the orientation of the beam cone emitted by the source and the orientation of the image plane system can be arranged according to the requirements of the overall system. A preferable configuration has a source emitting a beam cone in one direction and an image plane having a surface normal which is oriented almost perpendicular to this direction. In one embodiment the source emits horizontally and the image plane has a vertical surface normal. Some light sources like undulator or wiggler sources emit only in the horizontal plane. On the other hand the reticle should be arranged horizontally for gravity reasons. The beam path therefore has to be bent between the light source and the image plane about almost 90°. Since mirrors with incidence angles between 30° and 60° lead to polarization effects and therefore to light losses, the beam bending has to be done only with grazing incidence or normal incidence mirrors. For efficiency reasons the number of mirrors has to be as small as possible.

The illumination system preferably comprises a second optical element having a plurality of second raster elements. It is advantageous to insert a second optical element with second raster elements in the light path after the first optical element with first raster elements, wherein each of the first raster elements corresponds to one of the second raster elements. Therefore, the deflection angles of the first raster elements are designed to deflect the ray bundles impinging on the first raster elements to the corresponding second raster elements. The second raster elements are preferably arranged at the secondary light sources and are designed to image together with the second optical component the first raster elements or field raster elements into the image plane of the illumination system, wherein the images of the field raster elements are at least partially superimposed. The second raster elements are called pupil raster elements or pupil honeycombs. To avoid damaging the second raster elements due to the high intensity at the secondary light sources, the second raster elements are preferably arranged defocused of the secondary light sources, but in a range from 0 mm to 10% of the distance between the first and second raster elements.

By definition all rays intersecting the field in the image plane have to go through the exit pupil of the illumination system. The position of the field and the position of the exit pupil are defined by the object field and the entrance pupil of the projection objective. For some projection objectives being centered systems the object field is arranged off-axis of an optical axis, wherein the entrance pupil is arranged on-axis in a finite distance to the object plane. For these projection objectives an angle between a straight line from the center of the object field to the center of the entrance pupil and the surface normal of the object plane can be defined. This angle is in the range of 3° to 10° for EUV projection objectives. Therefore the components of the illumination system have to be configured and arranged in such a way that all rays intersecting the object field of the projection objective are going through the entrance pupil of the projection objective being decentered to the object field. For projection exposure apparatus with a reflective reticle all rays intersecting the reticle needs to have incidence angles greater than 0° to avoid vignetting of the reflected rays at components of the illumination system.

In the EUV wavelength region all components are reflective components, which are arranged preferably in such a way, that all incidence angles on the components are lower than 25° or greater than 65°. Therefore polarization effects arising for incidence angles around an angle of 45° are minimized. Since grazing incidence mirrors have a reflectivity greater than 80%, they are preferable in the optical design in comparison to normal incidence mirrors with a reflectivity greater than 65%.

The illumination system is typically arranged in a mechanical box. By folding the beam path with mirrors the overall size of the box can be reduced. This box preferably does not interfere with the image plane, in which the reticle and the reticle supporting system are arranged. Therefore it is advantageous to arrange and tilt the reflective components in such a way that all components are completely arranged on one side of the reticle. This can be achieved if the field lens comprises only an even number of normal incidence mirrors.

The illumination system as described before can be used preferably in a projection exposure apparatus comprising the illumination system, a reticle arranged in the image plane of the illumination system and a projection objective to image the reticle onto a wafer arranged in the image plane of the projection objective. Both, reticle and wafer are arranged on a support unit, which allows the exchange or scan of the reticle or wafer.

The projection objective can be a catadioptric lens, as known from U.S. Pat. No. 5,402,267 for wavelengths in the range between 100 nm and 200 nm. These systems have typically a transmission reticle.

For the EUV wavelength range the projection objectives are preferably all-reflective systems with four to eight mirrors as known for example from U.S. Ser. No. 09/503,640 showing a six mirror projection lens. These systems have typically a reflective reticle.

For systems with a reflective reticle the illumination beam path between the light source and the reticle and the projection beam path between the reticle and the wafer preferably interfere only nearby the reticle, where the incoming and reflected rays for adjacent object points are traveling in the same region. If there are no further crossing of the illumination and projection beam path it is possible to separate the illumination system and the projection objective except for the reticle region.

The projection objective has preferably a projection beam path between said reticle and the first imaging element which is tilted toward the optical axis of the projection objective. Especially for a projection exposure apparatus with a reflective reticle the separation of the illumination system and the projection objective is easier to achieve.

BRIEF DESCRIPTION OF THE DRAWINGS

The invention will be described below on the basis of drawings.

Here.

DESCRIPTION OF THE INVENTION

Figure 1:
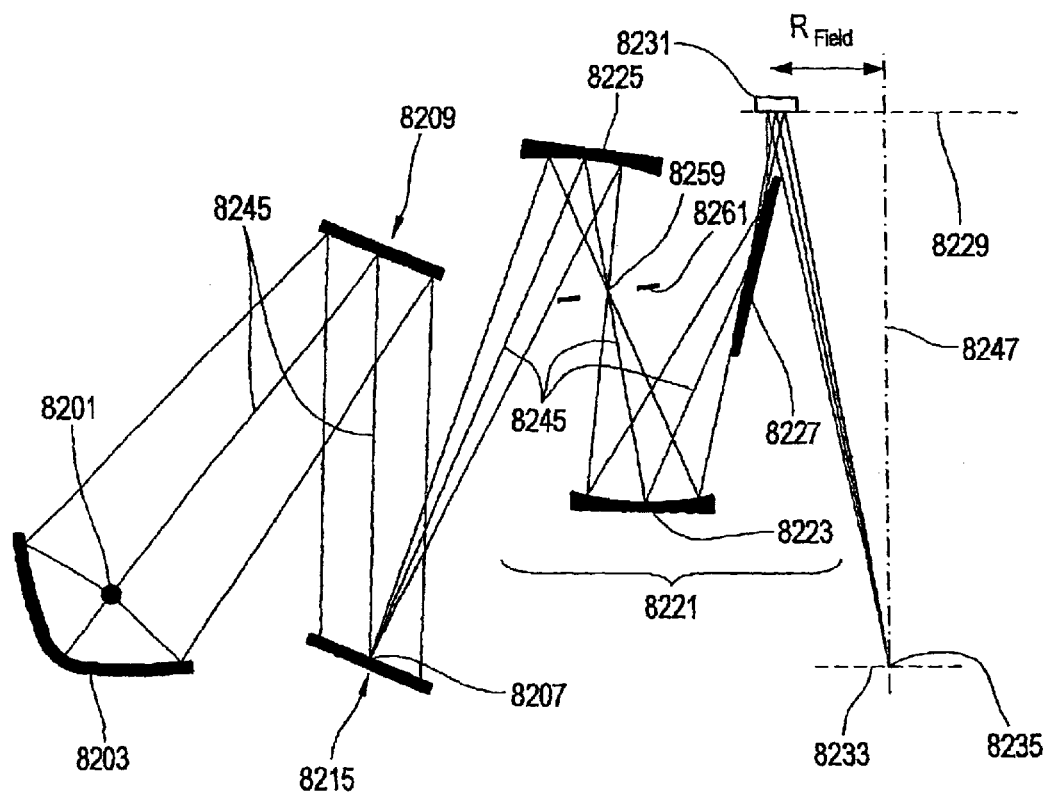
FIG. 1: A schematic view of an embodiment of an illumination system according to the invention with two conjugated pupil planes.

FIG. 1 shows a schematic view of a purely reflective embodiment of the invention comprising a light source 8201, a collector mirror 8203, a plate with the field raster elements 8209, a plate with pupil raster elements 8215, a second optical component 8221, a image plane 8229 and a exit pupil 8235. The second optical component comprises a first optical system having a third field mirror 8225 and second optical system having a second field mirror 8223. The third field mirror 8225 as well as the second field mirror 8223 have positive optical power. Furthermore the second optical component comprises a first field mirror 8227. The first field mirror 8227 is a grazing-incidence mirror with negative optical power for field shaping. In the purely reflective embodiment shown in FIG. 1 the field mirror 8225 and the field mirror 8223 are both concave mirrors forming an off-axis Gregorian telescope configuration. The field mirror 8225 images the secondary light sources 8207 in the plane conjugate to the exit pupil between the field mirror 8225 and the field mirror 8223 forming tertiary light sources 8259. In FIG. 1 only the imaging of the central secondary light source 8207 is shown. At the plane with the tertiary light sources 8259 conjugate to the exit pupil a masking unit 8261 is arranged to change the illumination mode of the exit pupil 8233. With stop blades it is possible to mask the tertiary light sources 8259 and therefore to change the illumination of the exit pupil 8233 of the illumination system. Possible stop blades have circular shapes or for example two or four circular openings, e.g. for quadropolar illumination. Alternatively or in addition to stop blades also transmission filters can be arranged in or near the plane with tertiary light sources. The field mirror 8223 and the field mirror 8227 image the tertiary light sources 8259 into the exit pupil 8233 of the illumination system forming quaternary light sources 8235.

The optical axis 8245 of the illumination system is not a straight line but is defined by the connection lines between the single components being intersected by the optical axis 8245 at the centers of the components. Therefore, the illumination system is a non-centered system having an optical axis 8245 being bent at each component to get a beam path free of vignetting. There is no common axis of symmetry for the optical components. Projection objectives for EUV exposure apparatus are typically centered systems with a straight optical axis and with an off-axis object field. The optical axis 8247 of the projection objective is shown as a dashed line. The distance between the center of the field 8231 and the optical axis 8247 of the projection objective is equal to the field radius $R_{field}$. The field mirrors 8223, 8225 are designed as on-axis toroidal mirrors, which means that the optical axis 8245 paths through the vertices of the on-axis toroidal mirrors 8223, 8225 and 8227. The second and the third field mirror 8223 and 8225 are normal incidence mirrors, which means that the incidence angles of the incoming rays with respect to the surface normals at the points of incidence of the incoming rays on the second and the third mirror are preferably lower than 25°.

The first field mirror 8227 is a grazing incidence mirror, which means that the incidence angles of the incoming rays with respect to the surface normal at the points of incidence of the incoming rays on the first mirror are preferably greater than 70°.

In the embodiment depicted in FIG. 1 the second optical component comprising the first 8227, second 8223 and third field mirror 8225 has only virtual conjugate planes to the image plane 8229. This provides for a compact size of the second optical component with low refractive power for the field mirrors.

Figure 2:
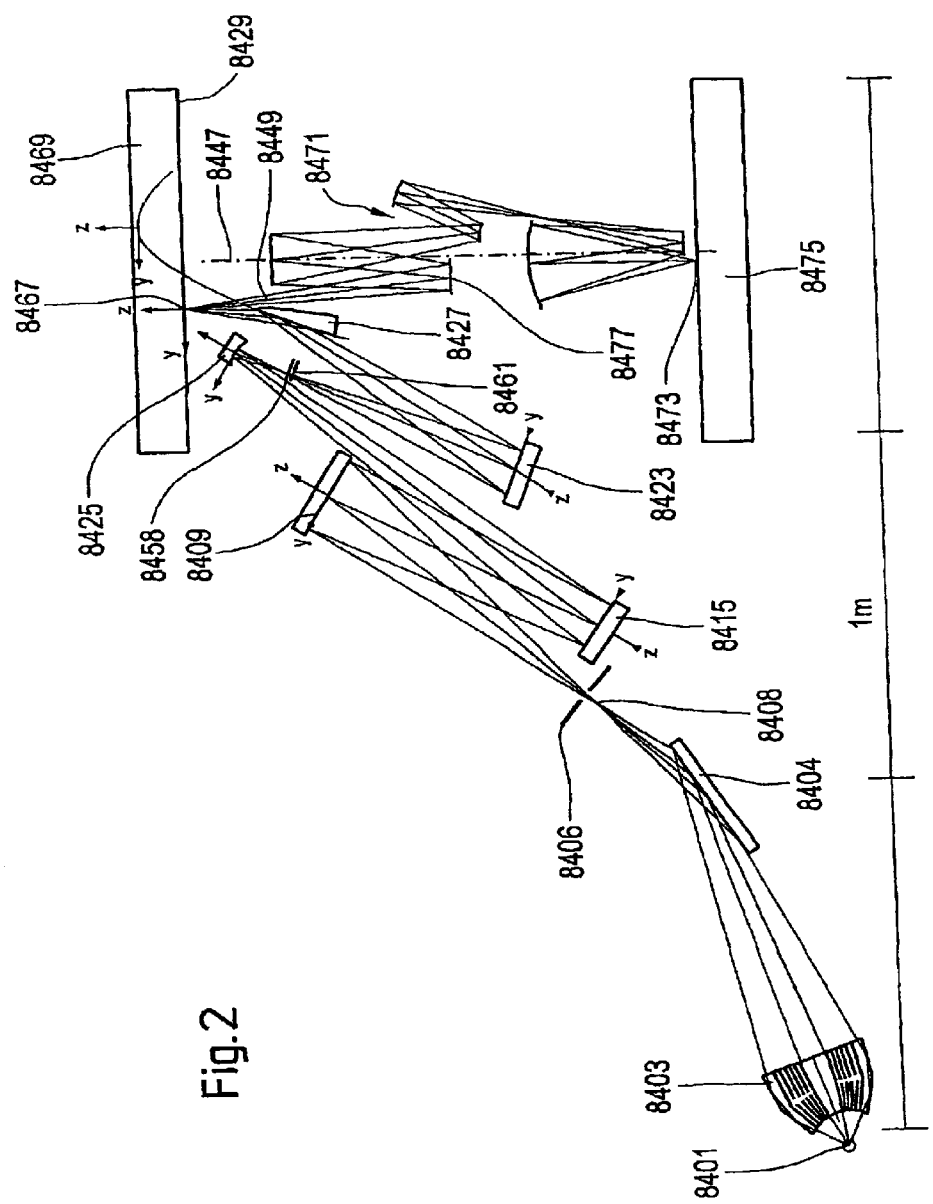
FIG. 2: A detailed view of a projection exposure apparatus with a illumination system according to FIG. 1.

FIG. 2 shows an EUV projection exposure apparatus in a detailed view. Corresponding elements have the same reference numbers as those in FIG. 1 increased by 200. Therefore, the description to these elements is found in the description to FIG. 1. The illumination system according to FIG. 2 comprises instead of the normal incidence collector 8203 a grazing incidence collector 8403 with a plurality of reflecting surfaces. Furthermore, for filtering the wavelength the illumination system comprises a grating element 8404 and a diaphragm 8406. An intermediate image 8408 of the primary light source 8401 lies at the diaphragm 8406. The system comprises as the system shown in FIG. 1 a first optical element with first raster elements 8409 and a second optical element with second raster element 8415 and a second optical component with a first field mirror 8427, a second field mirror 8423 and a third field mirror 8425. The second field mirror 8423 and the third field mirror 8425 are both concave mirrors. The field mirror 8425 images the secondary light sources in the plane conjugate to the exit pupil between the field mirror 8425 and the field mirror 8423 forming tertiary light sources. At the plane 8458 with the tertiary light sources conjugate to the exit pupil, a masking unit 8461 can be arranged to change the illumination mode of the exit pupil. The field mirror 8423 and the field mirror 8427 image the tertiary light sources into the exit pupil, not shown in FIG. 2, of the illumination system forming quaternary light sources.

The data for the optical components of the system according to FIG. 2 are given in table 1. The components are shown in a y-z sectional view, wherein for each component the local co-ordinate system with the y- and z-axis is shown. For the field mirrors 8423, 8425 and 8427 the local co-ordinate systems are defined at the vertices of the mirrors. For the two plates with the raster elements the local co-ordinate systems are defined at the centers of the plates. In table 1 the local co-ordinate systems with respect to the local co-ordinate system of image plane is given. The tilt angle a about the x-axis of the local co-ordinate system results after the translation of the reference co-ordinate system in the image plane into the local co-ordinate system. All co-ordinate systems are right handed systems.

TABLE 1

Co-ordinate system of the optical components

|  | y | z | α | $R_x$ | $R_y$ | $K_y$ |
|---|---|---|---|---|---|---|
| Intermediate image 8404 | 1031.11 | −1064.50 | 38.9 | | | |
| Field raster elements 8409 | 478.51 | −379.65 | 32.75 | −833.27 | spherical | |
| Pupil raster elements 8415 | 836.71 | −1094.97 | 212.1 | −972.9 | spherical | |
| Third field mirror 8425 | 104.54 | −144.22 | 30.6 | −264.68 | −268.67 | |
| Conjugate plane to exit pupil | 164.59 | −281.68 | 203.6 | | | |
| Second field mirror 8423 | 424.82 | −877.31 | 208.9 | −831.34 | spherical | |
| First field mirror 8427 | −219.99 | 113.40 | −5.05 | −77.126 | hyperboloid | −1.1479 |
| Image plane 8429 | 0 | 0 | 0 | | | |
| Exit pupil | −125 | −1189.27 | 0 | | | |

In the image plane 8429 of the illumination system the reticle 8467 is arranged. The reticle 8467 is positioned by a support system 8469. The projection objective 8471 having six mirrors images the reticle 8467 onto the wafer 8473 which is also positioned by a support system 8475. The mirrors of the projection objective 8471 are centered on a common straight optical axis 8447. The arc-shaped object field is arranged off-axis. The direction of the beam path between the reticle 8467 and the first mirror 8477 of the projection objective 8471 is tilted to the optical axis 8447 of the projection objective 8471. The angles of the chief rays 8479 with respect to the normal of the reticle 8467 are between 3° and 10°, preferably 5° and 7°. As shown in FIG. 1 the illumination system 8479 is well separated from the projection objective 8471. The illumination and the projection beam path interfere only nearby the reticle 8467.

What is claimed is:

1. Illumination system, particularly for microlithography with wavelengths ≦ 193 nm, comprising:
   a primary light source;
   a first optical component;
   a second optical component;
   an image plane; and
   an exit pupil,
   wherein said first optical component transforms said primary light source into a plurality of secondary light sources that are imaged by said second optical component in said exit pupil,
   wherein said first optical component includes a first optical element having a plurality of first raster elements, that are imaged into said image plane producing a plurality of images being superimposed at least partially on a field in said image plane,
   wherein said second optical component, comprises a first optical system comprising at least a field mirror with positive optical power and a second optical system comprising at least a further field mirror with positive optical power,
   wherein said first optical system images said plurality of secondary light sources in a plane between said first optical system and said second optical system forming a plurality of tertiary light sources, and
   wherein said second optical system images said plurality of tertiary light sources in said exit pupil.

2. The illumination system according to claim 1, wherein conjugated planes to the image plane in the second optical component are virtual conjugated planes.

3. The illumination system according to claim 1, wherein the field mirror and the further field mirror form an off-axis Gregorian telescope.

4. The illumination system according to claim 1, wherein said plane between said first optical system and said second optical system is freely accessible.

5. The illumination system according to claim 1, further comprising a masking unit for changing an illumination mode, wherein said masking unit is arranged at or nearby said plurality of tertiary light sources.

6. The illumination system according to claim 1, wherein a transmission filter is arranged at or nearby said plurality of tertiary light sources.

7. The illumination system according to claim 1, wherein each of a plurality of rays intersects said further field mirror with an incidence angle lower than 25° relative to surface normals.

8. The illumination system according to claim 1, wherein said further field mirror is an off-axis segment of a rotational symmetric reflective surface.

9. The illumination system according to claim 1, wherein said further field mirror is an on-axis segment of a toroidal reflective surface.

10. The illumination system according to claim 1, wherein each of a plurality of rays intersects said field mirror with an incidence angle of less than 25° relative to surface normals.

11. The illumination system according to claim 1, wherein said field mirror is an off-axis segment of a rotational symmetric reflective surface.

12. The illumination system according to claim 1, wherein said field mirror is an on-axis segment of a toroidal reflective surface.

13. The illumination system according to claim 1,
    wherein said plurality of first raster elements are rectangular,
    wherein said field is a segment of an annulus, and
    wherein said second optical component includes a field mirror for shaping said field to said segment of said annulus.

14. The illumination system according to claim 13, wherein said field mirror for shaping said field to said segment of said annulus has negative optical power.

15. The illumination system according to claim 13, wherein each of a plurality of rays intersects said field mirror for shaping said field to said segment of said annulus with an incidence angle greater than 70° relative to surface normals.

16. The illumination system according to claim 13, wherein said field mirror for shaping said field to said segment of said annulus is an off-axis segment of a rotational symmetric reflective surface.

17. The illumination system according to claim 13, wherein said field mirror for shaping said field to said segment of said annulus is an on-axis segment of a toroidal reflective surface.

18. The illumination system according to claim 13,
    wherein said first optical component further comprises a second optical element having a plurality of second raster elements, and
    wherein each of said plurality of first raster elements corresponds to one of said plurality of second raster elements.

19. The illumination system according to the claim 18, wherein said plurality of second raster elements and said second optical component image said corresponding plurality of first raster elements into said image plane.

20. The illumination system according to claim 18, wherein said plurality of second raster elements are concave mirrors.

21. A projection exposure apparatus for microlithography comprising:
    the illumination system of claim 1;
    a reticle being located at said image plane;
    a light-sensitive object on a support system; and
    a projection objective to image said reticle onto said light-sensitive object.

* * * * *